United States Patent
Nakano

(10) Patent No.: US 6,292,920 B1
(45) Date of Patent: *Sep. 18, 2001

(54) TRANSMISSION RATE JUDGMENT METHOD AND APPARATUS

(75) Inventor: Takayuki Nakano, Yokohama (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,340

(22) Filed: Nov. 19, 1998

(30) Foreign Application Priority Data

Nov. 26, 1997 (JP) .................................................. 9-340567

(51) Int. Cl.⁷ .......................... H03M 13/35; H03M 13/41
(52) U.S. Cl. ............................................ 714/774; 714/795
(58) Field of Search ..................................... 714/774, 795

(56) References Cited

U.S. PATENT DOCUMENTS

| | | | |
|---|---|---|---|
| 4,901,307 | 2/1990 | Gilhousen et al. | 370/18 |
| 5,396,516 | 3/1995 | PADOVANI et al. | 375/225 |
| 5,627,845 | 5/1997 | ASANO et al. | 371/43 |
| 5,689,511 * | 11/1997 | Shimazaki et al. | 370/545 |
| 5,771,226 * | 6/1998 | Kaku | 370/232 |
| 5,883,923 * | 3/1999 | Shimazaki | 375/225 |
| 5,917,837 * | 6/1999 | Stein | 371/37.7 |
| 5,978,428 * | 11/1999 | Hayashi | 375/377 |
| 6,108,372 * | 8/2000 | Tidemann, Jr. et al. | 375/225 |
| 6,111,912 * | 8/2000 | Cohen et al. | 375/225 |

FOREIGN PATENT DOCUMENTS

| | | |
|---|---|---|
| 763902 | 3/1997 | (EP) . |
| 8-130535 | 5/1996 | (JP) . |
| 9501548 | 2/1997 | (JP) . |
| 9-98150 | 4/1997 | (JP) . |
| 95/01032 | 1/1995 | (WO) . |

OTHER PUBLICATIONS

English Language Abstract of JP 8–130535.
English Language Abstract of JP 9–98150.

* cited by examiner

*Primary Examiner*—Stephen M. Baker
(74) *Attorney, Agent, or Firm*—Greenblum & Bernstein P.L.C.

(57) ABSTRACT

Symbol repetition number counting section 108 counts the number of received symbol repetitions and decoding order determination section 109 determines the decoding order for anticipated rates in the high-to-low order of likelihood of each rate being the transmission rate of the received symbol based on the counted symbol repetition number.

5 Claims, 7 Drawing Sheets

TRANSMISSION RATE JUDGMENT METHOD AND APPARATUS

BACKGROUND OF THE INVENTION

1. Field of the Invention

The present invention relates to transmission rate judgment methods and their apparatuses.

2. Description of the Related Art

Recently, with drastically growing demands for terrestrial mobile communications such as car telephones and portable telephones, great importance is attached to a technology to allow effective utilization of frequencies to secure capacities for as many subscribers as possible with limited frequency bands. As one of multiple access systems for effective utilization of frequencies, the code division multiple access (CDMA) system is attracting attention. The CDMA system is a multiple access system that utilizes a spread spectrum communication technology, capable of achieving the excellent communication quality through its wideband and sharp correlation characteristics using pseudo noise (PN) series, etc. Terrestrial mobile communication systems using the CDMA system are described, for example, in U.S. Pat. No. 4,901,307.

A mobile communication system using the CDMA system can increase its system capacity by introducing variable rate transmission. For example, in variable rate voice CODEC, the data rate changes in units of a 20 msec section, called "frame" in accordance with the voice activity. Transmitting only the amount of information necessary to send the corresponding voice signal in each frame makes it possible to reduce interference to other users and increase the system capacity as well.

On the transmitting side, after voice coding, the system adds a CRC bit to check the frame quality, for example, and performs convolutional coding. The convolutional-coded data are repeated according to the data rate and have frames of the same length irrespective of the data rate. After being subjected to processing such as block interleave, spreading and modulation, the data are transmitted.

Then, a conventional transmission rate judgment apparatus is explained with reference to drawings. FIG. 1 is a block configuration diagram of a conventional transmission rate judgment apparatus.

In FIG. 1, the conventional transmission rate judgment apparatus judges a transmission rate using variable rate decoding section 501. This variable rate decoding section 501 comprises derepeating section 502 that combines or adds repeated symbols in accordance with the rate to be demodulated, Viterbi decoding section 503 that performs Viterbi decoding on the output symbol of derepeating section 502 and outputs decoded data, and CRC checking section 504 that performs a CRC check on the Viterbi-decoded data. It also comprises convolutional coding section 505 that performs convolutional coding on the output of Viterbi decoding section 503 and symbol error number counting section 506 that calculates the number of symbol errors in a frame using the output of derepeating section 502 and the output of convolutional coding means 505. It further comprises rate judgment section 507 that judges the rate based on the CRC check result and the reliability and the number of symbol errors of Viterbi decoding.

The sections from derepeating section 502 to symbol error number counting section 506 can perform processing according to multiple anticipated data rates, for example, full rate, ½ rate, ¼ rate and ⅛ rate. Since the data rate varies from one frame to another, the system performs this processing for all rates or some rates, and estimates and judges the transmission rate.

Then, the rate judgment procedure is explained with reference to FIG. 2 and FIG. 3. FIG. 2 is a flow diagram showing the procedure for decoding a received symbol and judging the rate. As shown in FIG. 2, after performing the respective processing from derepeating section 502 to symbol error number counting section 506 for all anticipated rates (step 601), the system makes a judgment according to the result (step 602). In step 602, this method makes a judgment using the quality information of all rates, that is, the CRC check results, Viterbi decoding reliability and number of symbol errors of all rates.

FIG. 3 is a flow diagram showing the procedure for judging the rate through decoding of each rate and quality judgment. As shown in FIG. 3, the system carries out processing from derepeating section 502 to symbol error number counting section 506 sequentially starting from a specific rate and makes a judgment in the process. In step 701, it carries out processing from derepeating section 502 to symbol error number counting section 506 for the rate with the largest quantity of information (full rate), and in step 702 it makes a judgment based on the quality information of the full rate. If the judgment result is acceptable, the system judges it as a full rate (step 710) and the process ends here. If the judgment result is not acceptable, the system carries out processing from derepeating section 502 to symbol error number counting section 506 for a ½ rate which has half the quantity of information of the full rate (step 703) and in step 704 it makes a judgment based on the quality information of the ½ rate. Rate judgment is continued in this way repeating the same sequential processing.

However, the conventional transmission rate judgment apparatus above needs to perform decoding for all rates or multiple rates, having the problem of increasing the amount of processing and hence increasing power consumption. For battery-operated apparatuses, for example portable terminals in particular, an increase in power consumption leads to a decrease of conversation time and waiting time.

SUMMARY OF THE INVENTION

The present invention has been implemented taking account of the problem above and it is an objective of the present invention to provide a transmission rate judgment method and an apparatus for it that will reduce the amount of average decoding processing, making it possible to reduce power consumption.

The present invention detects the number of received symbol repetitions, determines the priority order of transmission rates in decoding the received signal based on this symbol repetition number and decodes the received symbol at this determined transmission rate.

This configuration allows decoding to be carried out starting from a rate which is most likely to be the transmission rate of the received symbol, making it possible to omit unnecessary decoding processing. This results in a reduction of power consumption.

DETAILED DESCRIPTION OF THE PREFERRED EMBODIMENTS

With reference now to the attached drawings, the embodiments of the present invention are explained below.

(Embodiment 1)

The transmission rate judgment apparatus according to Embodiment 1 of the present invention counts the number of received symbol repetitions, determines the priority order for anticipated rates based on the counted number of symbol repetitions, decodes the received symbol based on this priority order, judges the quality and determines the transmission rate.

Figure 1:
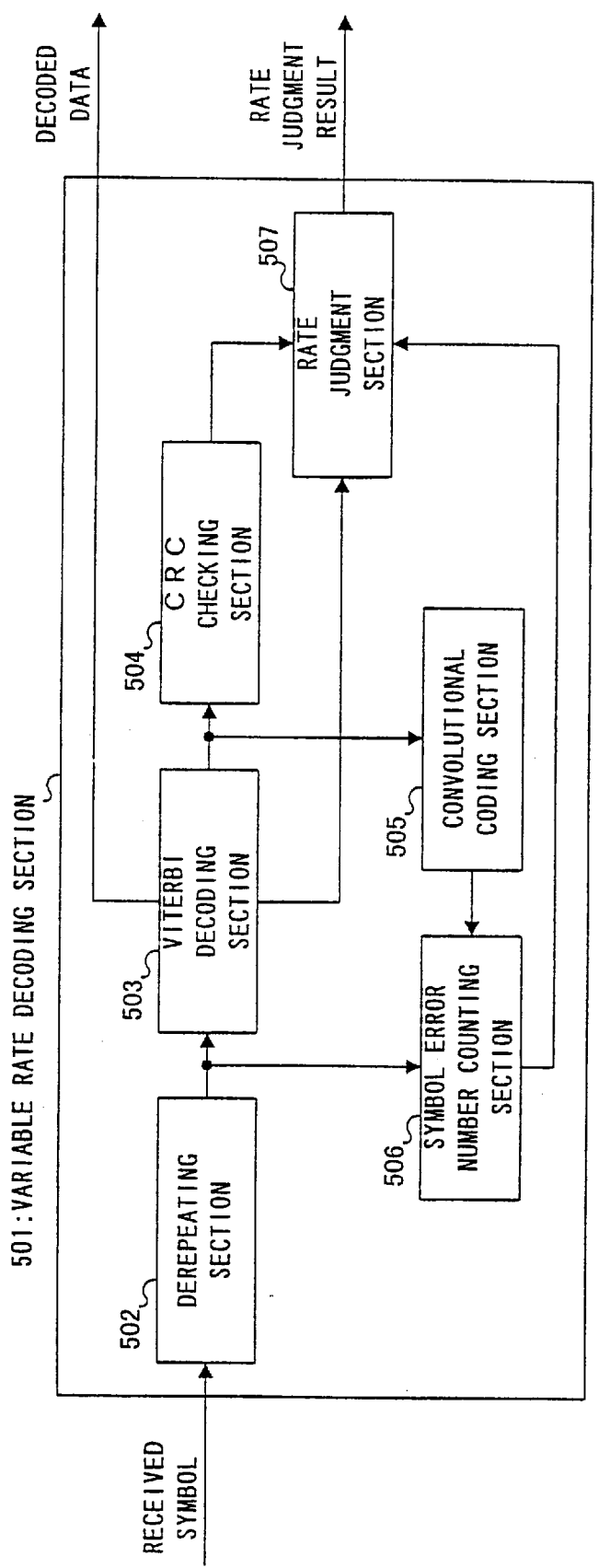
FIG. 1 illustrates a block configuration diagram of a conventional transmission rate judgment apparatus.
Figure 2:
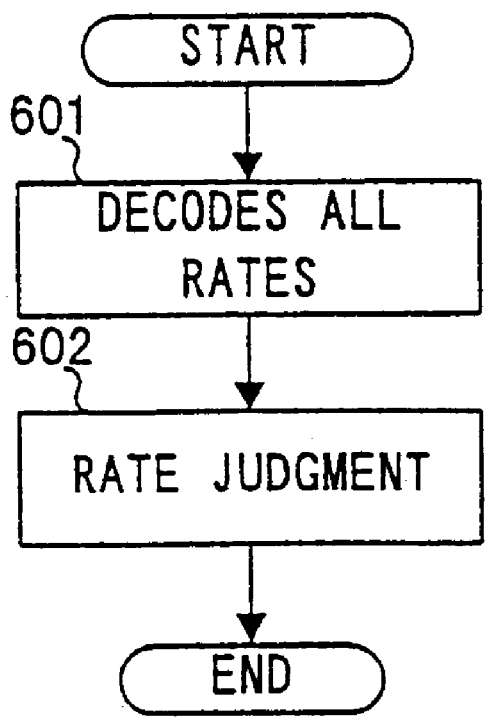
FIG. 2 illustrates an overall flow diagram of a conventional transmission rate judgment method and the judgment procedure of its apparatus.
Figure 3:
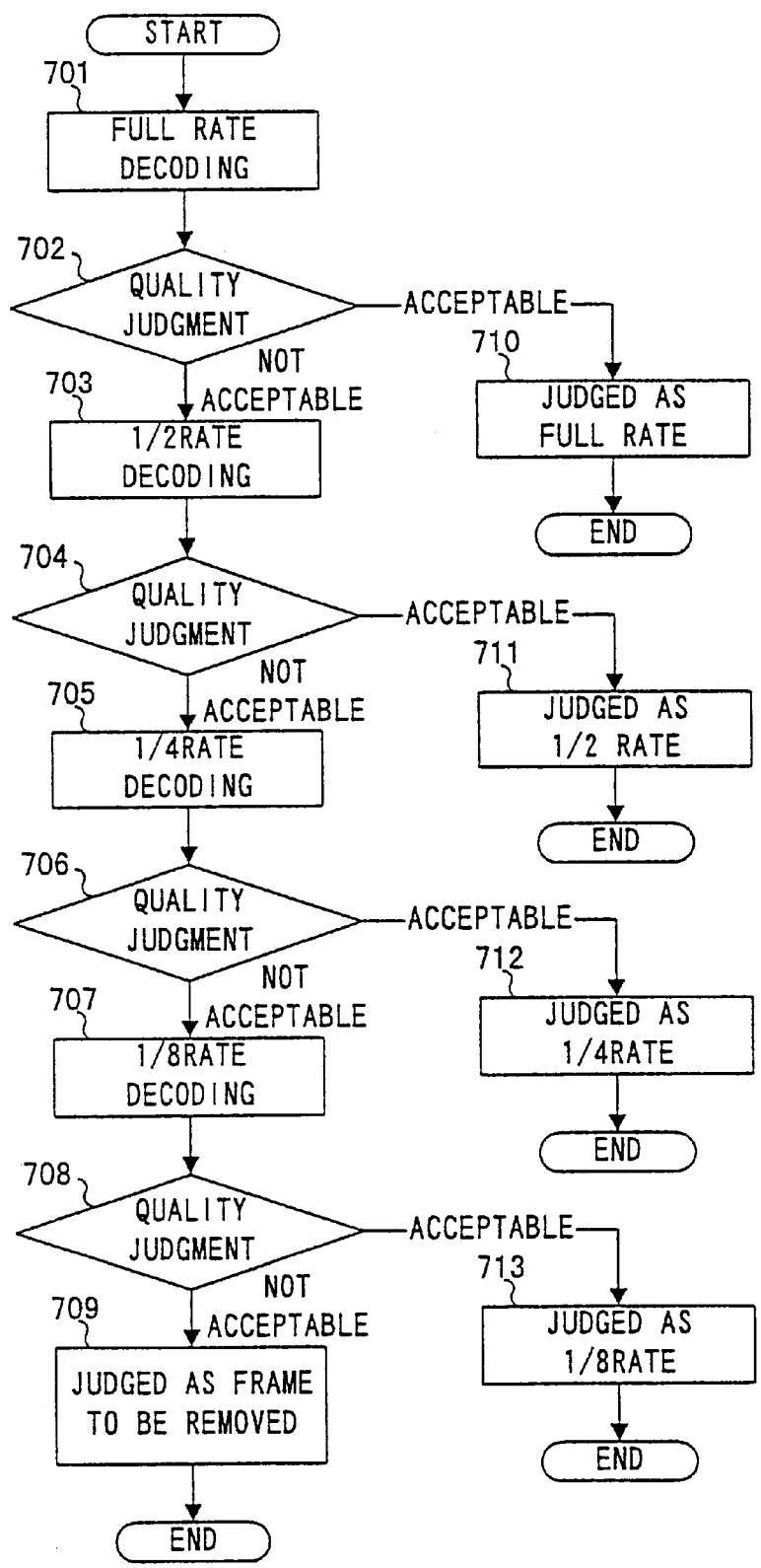
FIG. 3 illustrates a detailed flow diagram of the conventional transmission rate judgment method and the judgment procedure of its apparatus.
Figure 4:
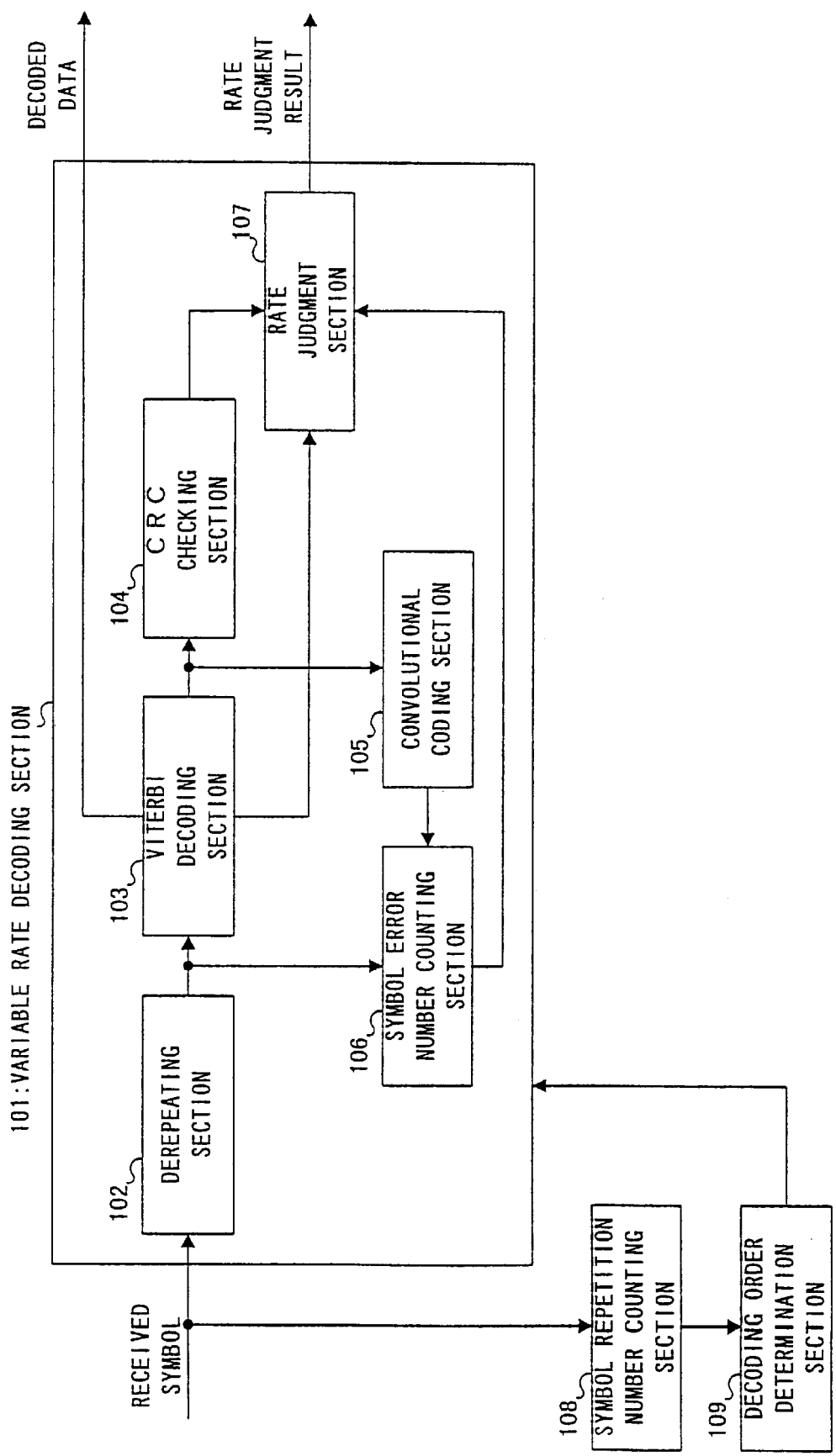
FIG. 4 illustrates a block configuration diagram of the transmission rate judgment apparatus according to Embodiment 1 of the present invention.

FIG. 4 is a block configuration diagram of the transmission rate judgment apparatus according to Embodiment 1 of the present invention. As shown in FIG. 4, the transmission rate judgment apparatus according to Embodiment 1 of the present invention judges the transmission rate using variable rate decoding section 101. This variable rate decoding section 101 comprises derepeating section 102 that combines a received symbol in accordance with the number of repetitions corresponding to the specified rate, Viterbi decoding section 103 that performs Viterbi decoding on the output of this derepeating section 102 and outputs decoded data, and CRC checking section 104 that performs a CRC check on Viterbi decoding section 103.

It also comprises convolutional coding section 105 that performs convolutional coding on the output of Viterbi decoding section 103 and symbol error number counting section 106 that counts the number of symbol errors using the output of derepeating section 102 and the output of convolutional coding means 105.

It further comprises rate judgment section 107 that judges the transmission rate based on the CRC check result which is the output of CRC checking section 104, the quality information in Viterbi decoding section 103 and the number of symbol errors which is the output of symbol error number counting section 106.

It further comprises symbol repetition number counting section 108 that counts the number of received symbol repetitions and decoding order determination section 109 that determines the decoding order based on the counted number of symbol repetitions.

In the received symbol which has been subjected to demodulation and despreading processing, the same symbol is repeated when the transmission rate is low. For example, if the symbol is transmitted without being repeated at a rate with the maximum quantity of information (full rate), the same symbol is repeated twice at a rate which has information half the full rate information (½ rate). Likewise, at a ¼ rate, the same symbol is repeated 4 times; ⅛ rate, 8 times.

Based on this repetition rule, symbol repetition number counting section 108 calculates the likelihood (possibility of the rate being the transmission rate of the received symbol) for each of the anticipated rates. At a ⅛ rate, for example, it calculates the number of symbols with the same code among 8 symbols. The more symbols of the same code, the higher the likelihood that the transmission rate of the received symbol will be ⅛ rate. The likelihood of other rates can be calculated in the same way. Decoding order determination section 109 determines the rate decoding order based on the likelihood of these rates. In Embodiment 1, decoding is performed in the high-to-low order of likelihood of rate. The system carries out processing from derepeating section 102 to symbol error number counting section 106 according to this order and judges rates sequentially.

Figure 5:
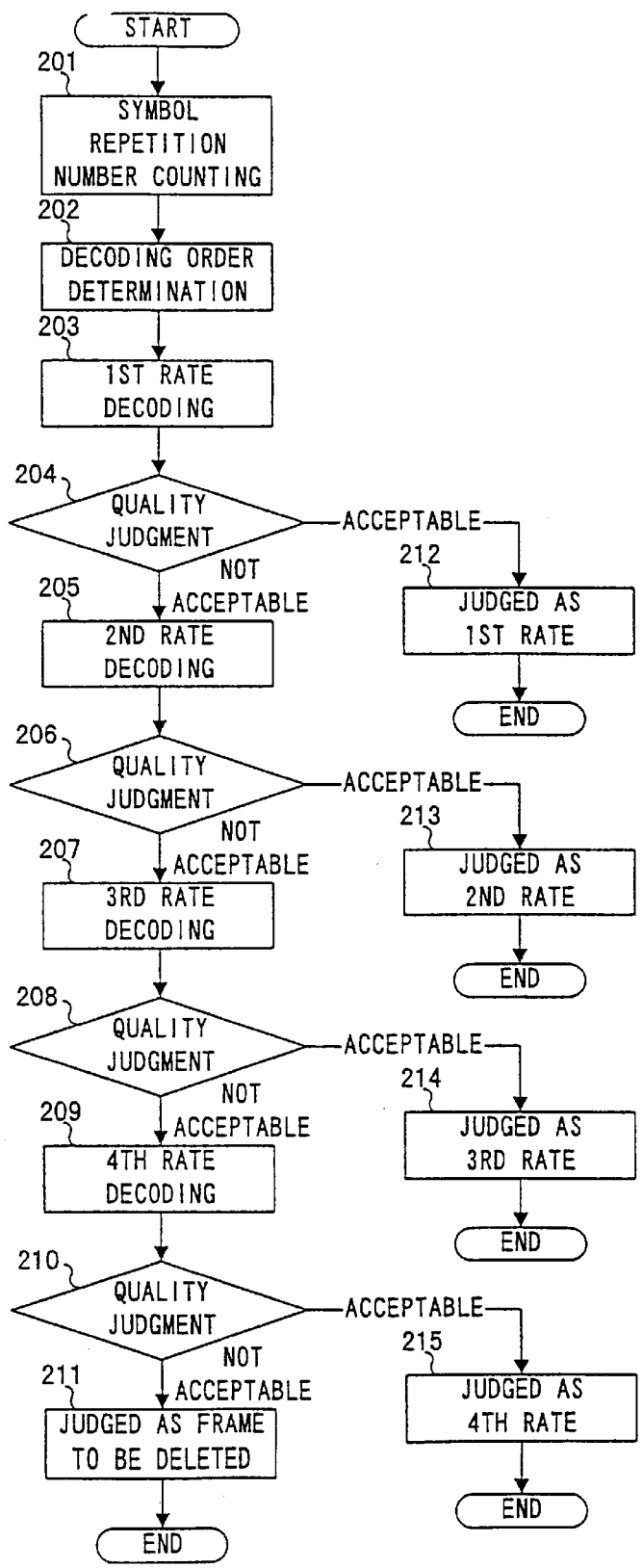
FIG. 5 illustrates a flow diagram of the judgment procedure of the transmission rate judgment apparatus according to Embodiment 1 of the present invention.

Then, the rate judging procedure is explained below with reference to the flow diagram in FIG. 5.

In step 201, the number of symbol repetitions is calculated to find the likelihood of each rate. In step 202, the order of decoding, that is, from which rate decoding is started, is determined based on this likelihood. The rate with the highest likelihood is designated as the first rate; the rate with the second highest likelihood, the second rate; the rate with the third highest likelihood, the third rate; and the rate with the fourth highest likelihood, the fourth rate.

In step 203, processing from derepeating section 102 to symbol error number counting section 106 is carried out sequentially for the first rate to obtain the quality information of the rate, that is, CRC check result, Viterbi decoding reliability and number of symbol errors. In step 204, the rate is judged based on the quality information. If the judgment result is acceptable, the first rate is judged to be the transmission rate of the received symbol (step 212) and the process ends here. If the judgment result is not acceptable, processing is carried out sequentially from derepeating section 102 to symbol error number counting section 106 for the second rate to obtain the quality information of the rate. Then, in step 206, the rate is judged based on the quality information of the second rate. Rate judgment is continued in this way repeating the same sequential processing.

Thus, according to Embodiment 1, decoding order determination section 109 carries out decoding and judgment starting from the rate which is most likely to be the transmission rate of the received symbol, making it possible to reduce the amount of average decoding processing and prevent an increase of power consumption.

(Embodiment 2)

Then, the transmission rate judgment apparatus according to Embodiment 2 of the present invention is explained below. The transmission rate judgment apparatus according to Embodiment 2 of the present invention measures the level of a received symbol, determines the priority order for anticipated rates based on the measured reception level, decodes the received symbol based on this priority order, judges the quality and determines the transmission rate.

Figure 6:
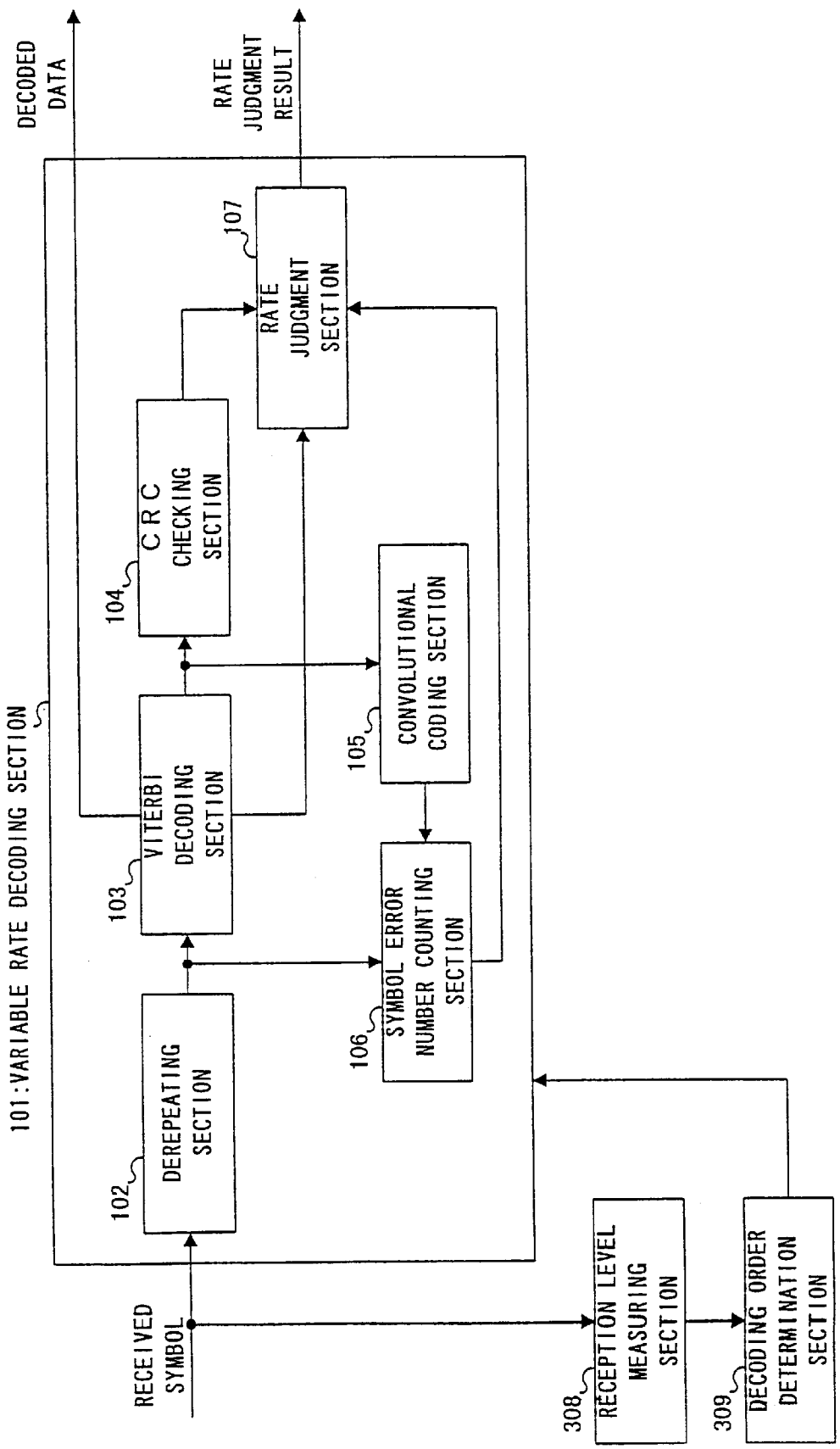
FIG. 6 illustrates a block configuration diagram of the transmission rate judgment apparatus according to Embodiment 2 of the present invention.

FIG. 6 is a block configuration diagram of the transmission rate judgment apparatus according to Embodiment 2 of the present invention. As shown in FIG. 6, the transmission rate judgment apparatus according to Embodiment 2 of the present invention is provided with reception level measuring section 308 that measures the level of a received symbol, decoding order determination section 309 that determines the decoding order based on the measured reception level, instead of symbol repetition number counting section 108 and decoding order determination section 109 in Embodiment 1 above. The rest of the configuration is the same as that of Embodiment 1 and thus their explanations are omitted here.

Power of the received symbol which has been subjected to demodulation and despreading processing is reduced when the transmission rate is low. For example, a rate which has the information quantity ½ (½ rate) that of the full rate which has the maximum information quantity has ½ power. Likewise, a ¼ rate has ¼ power; ⅛ rate, ⅛ power. Reception level measuring section 308 measures the level of the received symbol and decoding order determination section 309 determines the decoding order of the rate based on this measured level. It compares the reception level of the relevant frame and the anticipated level of each rate, designates the rate with the closest level as the first rate and other rates as the second to fourth rate in the order of closeness of the level. According to this order, processing is carried out sequentially from derepeating section 102 to symbol error number counting section 106 to judge rates sequentially.

Figure 7:
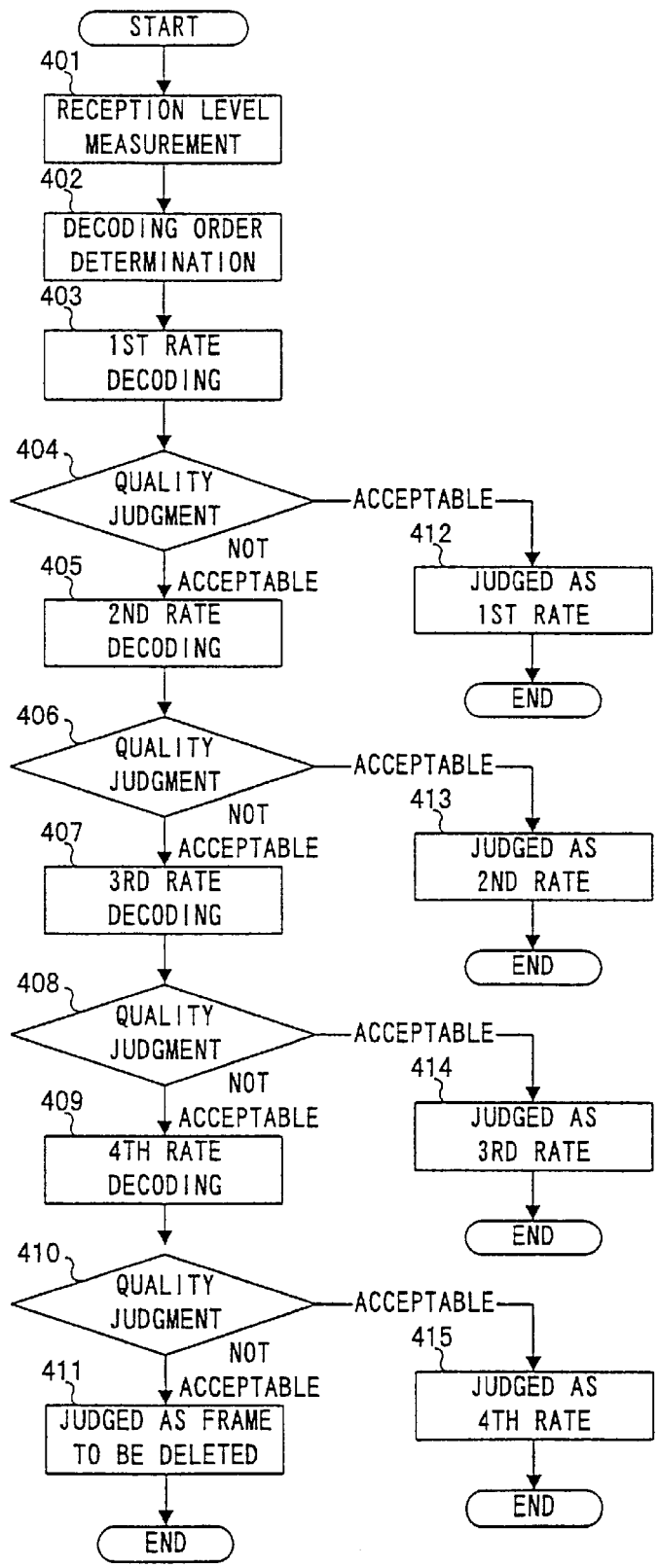
FIG. 7 illustrates a flow diagram of the judgment procedure of the transmission rate judgment apparatus according to Embodiment 2 of the present invention.

Then, the rate judging procedure is explained below with reference to the flow diagram in FIG. 7.

In step 401, the reception level is measured to find the likelihood of each rate. In step 402, the order of rate decoding is determined based on this likelihood. The rate with the highest likelihood is designated as the first rate; the rate with the second highest likelihood, the second rate; the rate with the third highest likelihood, the third rate; and the rate with the fourth highest likelihood, the fourth rate.

In step 403, processing is carried out sequentially from derepeating section 102 to symbol error number counting section 106 for the first rate to obtain the quality information of the rate, that is, CRC check result, Viterbi decoding reliability and number of symbol errors. In step 404, the rate is judged based on the quality information. If the judgment result is acceptable, the first rate is judged to be the transmission rate of the received symbol (step 412) and the process ends here. If the judgment result is not acceptable, processing is carried out sequentially in step 405 from derepeating section 102 to symbol error number counting section 106 for the second rate to obtain the quality information of the rate. Then, in step 406, the rate is judged based on the quality information of the second rate. Rate judgment is continued in this way repeating the same sequential processing.

Thus, according to Embodiment 2, decoding order determination section 309 carries out decoding and judgment starting from the rate which is most likely to be the transmission rate of the received symbol, making it possible to reduce the amount of average decoding processing and prevent an increase of power consumption.

As seen clearly from the explanation above, the present invention allows quality judgment to start from the rate which is most likely to be the transmission rate of the received symbol, making it easier to determine the transmission rate and reduce the amount of average processing. This results in a reduction of power consumption of the apparatus, and hence an extension of the waiting time.

This application is based on the Japanese Patent Application No. HEI 9-340567 filed on Nov. 26, 1997, entire content of which is expressly incorporated by reference herein.

What is claimed is:

1. A reception apparatus comprising:

a transmission rate judgment apparatus, comprising a symbol repetition number counting system that counts the number of received symbol repetitions and a rate determination system that determines, from the symbol repetition count, the priority order of transmission rate hypotheses to be used in decoding the received symbol;

a quality judgment system that judges the quality of decoded data;

an output system that outputs the judgment result of the quality judgment system;

a derepeating system that combines the received symbol in the repetition count corresponding to the specified rate, a Viterbi decoding system that carries out Viterbi decoding on the output of said derepeating system, a CRC checking system that carries out a CRC check on the output of said Viterbi decoding system, a convolutional coding system that carries out convolutional coding on the output of said Viterbi decoding system, a symbol error number counting system that counts the number of symbol errors from the output of said derepeating system and the output of said convolutional coding system, and a rate judgment system that judges the transmission rate based on the CRC check result which is the output of said CRC checking system, the quality information in said Viterbi decoding system and the number of symbol errors which is the output of said symbol error number counting system.

2. The reception apparatus according to claim 1, wherein said rate determination system determines the transmission rate used for decoding according to the determined priority order.

3. A mobile communication terminal apparatus comprising the reception apparatus according to claim 1 and which performs radio communications with a base station apparatus.

4. A mobile communication base station apparatus comprising the reception apparatus according to claim 1 and which performs radio communications with a mobile communication terminal apparatus.

5. A communication system, comprising a mobile communication terminal apparatus according to claim 3, and further comprising a mobile communication base station apparatus which performs radio communications with said mobile communication terminal apparatus.

* * * * *

UNITED STATES PATENT AND TRADEMARK OFFICE
CERTIFICATE OF CORRECTION

PATENT NO. : 6,292,920 B1
DATED : September 18, 2001
INVENTOR(S) : T. Nakano

Page 1 of 1

It is certified that error appears in the above-identified patent and that said Letters Patent is hereby corrected as shown below:

<u>Column 6,</u>
Line 2, after "apparatus" insert -- , --.

Signed and Sealed this

Twenty-sixth Day of March, 2002

Attest:

*Attesting Officer*

JAMES E. ROGAN
*Director of the United States Patent and Trademark Office*